(12) United States Patent
Amaducci

(10) Patent No.: US 10,491,109 B2
(45) Date of Patent: Nov. 26, 2019

(54) ACTIVE FILTER

(71) Applicant: Schaffner EMV AG, Luterbach (CH)

(72) Inventor: Alessandro Amaducci, Gerlafingen (CH)

(73) Assignee: Schaffner EMV AG, Luterbach (CH)

( * ) Notice: Subject to any disclaimer, the term of this patent is extended or adjusted under 35 U.S.C. 154(b) by 0 days.

(21) Appl. No.: 15/907,933

(22) Filed: Feb. 28, 2018

(65) Prior Publication Data

US 2018/0269781 A1   Sep. 20, 2018

(30) Foreign Application Priority Data

Mar. 17, 2017  (DE) .................. 10 2017 105 839

(51) Int. Cl.

| H03B 1/00 | (2006.01) |
|---|---|
| H03K 5/00 | (2006.01) |
| H04B 1/10 | (2006.01) |
| H02M 1/44 | (2007.01) |
| H01F 27/38 | (2006.01) |
| H05K 1/02 | (2006.01) |
| H02M 7/02 | (2006.01) |

(52) U.S. Cl.
CPC .............. *H02M 1/44* (2013.01); *H01F 27/38* (2013.01); *H05K 1/0233* (2013.01); *H02M 7/02* (2013.01)

(58) Field of Classification Search
CPC ............... H03H 11/0422; H03H 11/04; H03H 11/1291; H03H 11/1213; H03K 5/1252
USPC .................................................. 327/552–558
See application file for complete search history.

(56) References Cited

U.S. PATENT DOCUMENTS

| 6,222,245 | B1 * | 4/2001 | Bez .................. H01L 29/94 |
| | | | 257/532 |
| 6,898,092 | B2 | 5/2005 | Briere et al. |
| 8,823,448 | B1 * | 9/2014 | Shen .................. H04B 15/00 |
| | | | 327/552 |
| 2011/0127849 | A1 * | 6/2011 | Yoon .................. H03J 3/20 |
| | | | 307/109 |
| 2012/0199948 | A1 * | 8/2012 | Saisse .................. G06F 21/87 |
| | | | 257/532 |
| 2013/0038139 | A1 | 2/2013 | Shudarek et al. |
| 2013/0147419 | A1 | 6/2013 | Sakai et al. |
| 2014/0292401 | A1 * | 10/2014 | Shen .................. H03H 11/1217 |
| | | | 327/556 |

FOREIGN PATENT DOCUMENTS

| DE | 102005004177 A1 | 8/2006 |
| DE | 202016104468 U1 | 9/2016 |
| DE | 102015010713 A1 | 2/2017 |
| KR | 20150078133 A  * | 7/2015 |
| WO | WO-03/005578 A1 | 1/2003 |

OTHER PUBLICATIONS

Hy-Line Power Components GmbH: On-Board Stromversorgung, Ausgabe 2-2103, Munchen, 2013, S. 1-16, 16 pages.
German Search Report for DE 10 2017 105 839.7 dated Jan. 24, 2018, 10 pages.

* cited by examiner

*Primary Examiner* — Anh Q Tra
(74) *Attorney, Agent, or Firm* — Blank Rome LLP

(57) ABSTRACT

A power system for a vehicle comprising: a battery; a charging interface for receiving external power to charge the battery; a network connecting the battery and the charging interface, wherein at least a part of the network is a DC network; an active EMI filter between the battery and the charging interface in the DC network.

25 Claims, 4 Drawing Sheets

ACTIVE FILTER

FIELD OF THE INVENTION

The present invention refers to an active filter, in particular to an active filter for DC networks and/or for electric vehicles.

DESCRIPTION OF RELATED ART

Electric vehicles are equipped with different power electronics conversion stages. The coexistence of such many control and power signals in the limited space of the propulsion compartment of an electric vehicle represents a serious threat for the generation and propagation of electromagnetic interference (EMI). The use of shielded cables in the power train system together with several filtering stages became a standard praxis. However, if the power electronics converters has experienced a huge development in the last decade, the same cannot be said for the passive components. A main concern lays in the magnetic components, inductors and common mode chokes are widely used today to filter EMI; these are bulky and sometimes not suitable for mass production, in fact the high level of current of an electric vehicle powertrain raise the necessity to use high cross section cables or bus-bars with the understandable issue when they have to be wound around a magnetic core. Other technical issues are the performance requirements, the saturation current and the Curie temperature.

U.S. Pat. No. 6,898,092 suggests to use a feedforward active filter for EMI. However, this document does not disclose, how such an active filter could be realized for the high current appearing in the power train of an electric vehicle. In addition, it is not disclosed how this active filter could realize the large filtering bandwidth of an EMI filter between 150 kHz and 30 MHz. In particular for high frequencies, already very small delays in the active circuit could lead to the fact that the cancelling noise does not cancel the noise in the power line, but increases the noise.

BRIEF SUMMARY OF THE INVENTION

It is the object to find an EMI filter which overcomes the problems of the state of the art.

This object is achieved by using an active EMI filter in a network of an electric vehicle.

The active EMI filter has the advantage over passive EMI filters that the size and weight does not scale with increasing currents.

This object is achieved further by an active filter with a first power conductor, a second power conductor and an active circuit, wherein the active circuit comprises: a sensing section for sensing a noise in the first and/or second power conductor, a gain section for transforming the noise sensed in the sensing section into a cancelling noise and an injection section for injecting the cancelling noise from the gain section into the first power conductor and/or the second power conductor.

Further embodiments of the invention are described in the following.

In one embodiment, the injection section comprises a coupling capacitance configured to inject the cancelling noise in the first power conductor and the second power conductor. Preferably, the coupling capacitance comprises a plurality of parallel capacitors with different capacitive values. This has the advantage that the bandwidth characteristics of the coupling capacitance and thus of the injection section is enlarged.

In one embodiment, the sensing section comprises a current transformer to sense the noise current in the first power conductor and/or the second power conductor and the injection section comprises a coupling capacitance to inject the cancelling noise current in the first power conductor and second power conductor, wherein the sensing section and the injection section are arranged in a feedback configuration. The bandwidth and the performance of an active filter depend largely on the electrical parameters of the network and the device creating the EMI noise. It was found out that the described topology and the feedback configuration proofed to be the best solution for an electrical vehicle application; it is more stable and immune to environmental changes such as temperature and age degradation.

In one embodiment, the sensing section comprises a current transformer with a core inductively coupling the first power conductor, the second power conductor and an auxiliary conductor of the sensing circuit, wherein the auxiliary conductor is connected to the gain section.

In one embodiment, the core material has a constant permeability between 150 kHz and 30 MHz, preferably between 150 kHz and 100 MHz. While most applications use nanocrystaline core materials in order to obtain maximal permeability, those materials are not constant over the mentioned frequency range and therefore not well suited for this application.

In one embodiment, the core material comprises MgZn. This material proved to be best suitable for obtaining such a large bandwidth.

In one embodiment, the auxiliary conductor comprises a burden resistor or a transimpedance amplifier parallel to the current transformer to transform the measured noise current into a noise voltage.

In one embodiment, the auxiliary conductor comprises less than 3 windings around the core, preferably less than 2 windings. In a preferred embodiment, the auxiliary conductor comprises one winding or a half winding around the core. This has the advantage that the current transformer introduces a low parasitic inductance and capacitance in the active circuit which reduces the phase shift created by the active circuit.

In one embodiment, the winding of the auxiliary conductor can be made of a (solid copper) wire or via a PCB trace.

In one embodiment, each of the first and the second conductor has half a winding with respect to the core or in other words, the conductors are fed through the core without being wound around the core. This has the advantage that the conductors or busbars with their large cross-sectional areas for high currents do not need to be wound around the core. This simplifies the construction of the filter.

In one embodiment, the first conductor is a first busbar, the second conductor is a second busbar and the core is a ring core enclosing the first busbar and the second busbar. This has the advantage that the busbars with their large cross-sectional areas for high currents do not need to be wound around the core. This simplifies the construction of the filter. Preferably, a printed circuit board is arranged between the first busbar and the second busbar at least in the opening of the ring core. Like this, the two conductors can be electrically isolated from each other notwithstanding their proximity.

In one embodiment, a printed circuit board (PCB) comprises the active circuit, wherein the first busbar and/or the second busbar are directly connected on the PCB for the connection with the injection section. This has the advantage that the active circuit with its small currents can be implemented on the PCB, while the busbars can be directly connected on the PCB. This fastens and simplifies manufacturing of the filter.

In one embodiment, the first and the second busbar are connected to the PCB by means of direct soldering, screwing, or smt insert soldered and/or screwed to the busbar and the PCB.

In one embodiment, the current transformer is a (DC) current compensated. This has the advantage that the magnetic flux from the DC current flowing in the two power conductors is arranged in opposed directions and cancel each other out. Therefore, there is no risk of saturation of the core material.

In one embodiment, the magnetic fluxes due to the EMI current flowing in the power conductors sum to each other thus realizing the sensing function of the current transformer.

In one embodiment, a printed circuit board comprises the active circuit, wherein the core is a ring core, wherein the PCB comprises two recesses and a protrusion between the two recesses, wherein the ring core is received in the two recesses such that the protrusion extends through an opening formed by the ring core. This arrangement allows a robust arrangement of the core and the active filter. In addition, it is possible to realize the winding(s) of the auxiliary conductor on the PCB.

In one embodiment, the active circuit is connected to the same ground of the system in which the filter is installed; therefore the cancelling noise current injected in the first power conductor and the second power conductor can flow back to the active circuit through said ground connection.

In one embodiment, the ground connection is a specific and mandatory feature of the Active Filter.

In one embodiment, the gain section comprises an operation amplifier. The operational amplifier has been used due to its wideband performance and the thermal stability.

In one embodiment, the EMI filter has a bandwidth of at least from 150 kHz to 30 MHz.

In one embodiment, the EMI filter is for a DC network. The described embodiments can be combined.

While the active filter was described for an automotive application or a vehicle, it is also possible to apply this active filter for other applications, especially for any DC application such as solar panel energy applications. While the active filter was described for filtering EMI, it is also possible to apply this filter for other frequencies.

BRIEF DESCRIPTION OF THE DRAWINGS

The invention will be better understood with the aid of the description of an embodiment given by way of example and illustrated by the figures, in which.

DETAILED DESCRIPTION OF POSSIBLE EMBODIMENTS OF THE INVENTION

Figure 1:
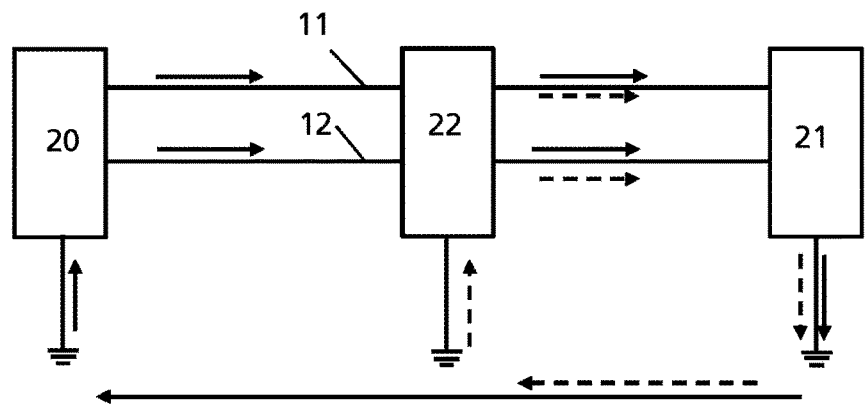
FIG. 1 shows the working principle of the active filter.

FIG. 1 shows the working principle of the present active filter. A DC network 21 has a first power conductor 11 and a second power conductor 12 for conducting the DC main currents. A device 20 connected over the first and second power conductors 11 and 12 with the network creates noise, in particular EMI. The noise flows on the first and second conductor 11, 12 in the network 21 as shown with the solid arrows and flows back to the device 20 over the ground connection. An active filter 22 is now installed between the device 20 and the network 21 to create a cancelling noise and to inject the cancelling noise in the first and second power conductor 11, 12 in order to cancel the noise from the device 20. As a consequence, the noise is cancelled by the cancelling noise between the active filter 22 and the network 21. The cancelling noise flows from the active filter 22 to the network 21 and then over the ground connection back to the active filter 22.

Preferably, the DC network 21 is configured for currents above 50 A, preferably above 75 A and more preferably above 100 A. Preferably, the voltage of the DC network 21 is above 2 V. Preferably, a nominal voltage of the DC network 21 is below 800 V. Preferably, the nominal voltage is 12 V.

The active filter 22 is configured for such a DC network 21. The active filter 22 is preferably an EMI filter. The active filter 22 has preferably a filtering bandwidth at least between 150 kHz and 10 MHz, preferably at least between 150 kHz and 30 MHz. A filter having a bandwidth in a frequency range means that the filter reduces with attenuation higher than 0 db all the noise frequencies in this frequency range in the first and second conductor 11 and 12. Preferably, the filter reduces with attenuation higher than 10 db all the noise frequencies in this frequency range in the first and second conductor 11 and 12. The input of the active filter 22 is the side of the filter from which the noise comes, i.e. in FIG. 1 the side of device 20. The output of the active filter 22 is the side of the filter in which the noise flows, i.e. in FIG. 1 the side of the network 21. The active filter 22 is preferably configured to filter common mode noise.

Figure 2:
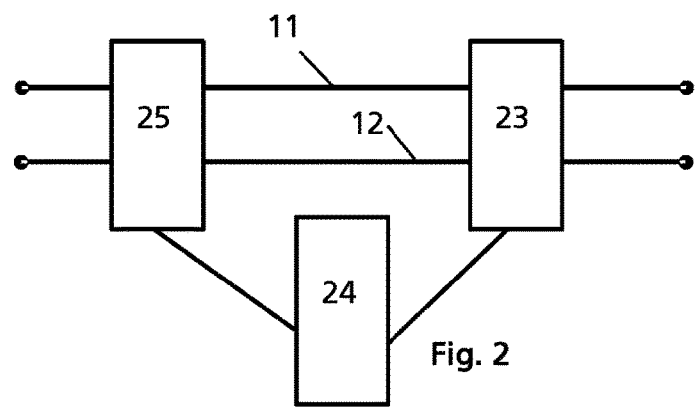
FIG. 2 shows a schematic view of an embodiment of the active filter.

FIG. 2 shows a schematic view of the active filter 22. The active filter 22 comprises a first power conductor 11, a second power conductor 12, a sensing section 23, a gain section 24 and an injection section 25.

The first power conductor 11 and the second power conductor 12 of the active filter 22 are configured to conduct the main current between the device 20 and the network 21. The first power conductor 11 and the second power conductor 12 are configured for the currents and/or voltages mentioned above. Preferably, the first power conductor 11 and the second power conductor 12 have a cross-sectional area of at least 10 square millimetres. Preferably, the first power conductor 11 and the second power conductor 12 are busbars. Preferably, the first power conductor 11 and the second power conductor 12 have a terminal on one or two sides of the filter to connect the first power conductor 11 and the second power conductor 12 with the device 20 and the network 21. However, it is also possible to integrate the active filter in the device 20 or in other devices or networks 21.

The sensing section 23 is configured to sense the noise in the first and second power conductor 11 and 12. A point in the first and/or second power conductor 11 and/or 12 where the sensing section 23 senses the noise is called in the following sensing point. The gain section 24 is configured to create a cancelling noise on the basis of the sensed noise. The injection section 25 is configured to inject the cancelling noise into the first and second power conductor 11 and/or 12 such that the noise is cancelled (or at least reduced) by the cancelling noise. A point in the first and/or second power conductor 11 and/or 12 where the injection section 25 injects the cancelling noise is called in the following injection point.

There are many design options for providing an active filter.

First, the active filter 22 can be arranged in a feedback or a feedforward orientation. A feedback orientation means that the injection point is arranged before or upstream of the sensing point in the direction of the noise. In other words, a feedback orientation means that the injection point is arranged between the input of the active filter 22 and the sensing point. A feedforward orientation means that the injection point is arranged after or downstream of the sensing point in the direction of the noise. In other words, a feedforward orientation means that the injection point is arranged between the output of the active filter 22 and the sensing point.

Figure 3:
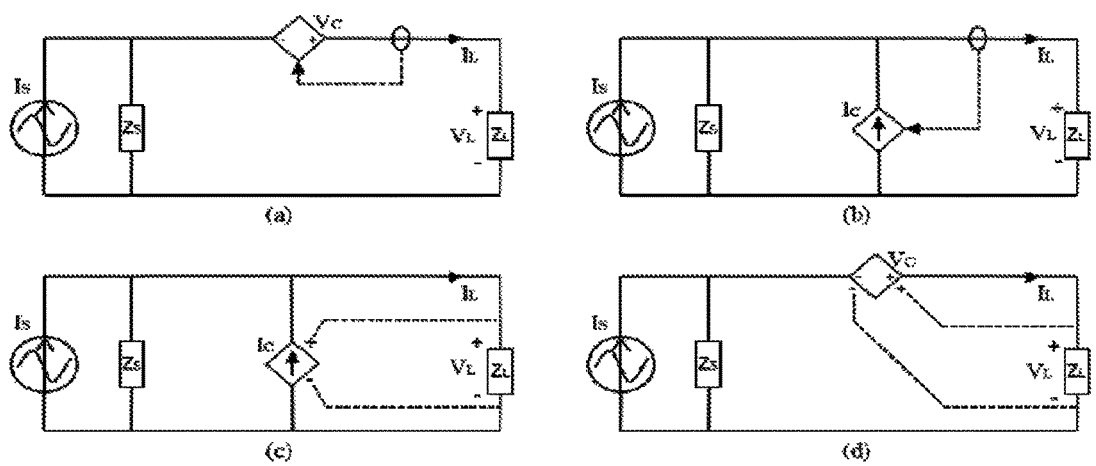
FIG. 3 shows a schematic view of four potential topologies for active filters.

Second, there are four topologies for an active filter 22 as shown in FIG. 3. Topology (a) measures a noise current and injects a cancelling noise voltage. Topology (b) measures a noise current and injects a cancelling noise current. Topology (c) measures a noise voltage and injects a cancelling noise current. Topology (d) measures a noise voltage and injects a cancelling noise voltage. All four topologies in FIG. 3 are shown in a feedback orientation. The topologies (b) and (d) can also be arranged in a feedforward orientation. In the past, the parameters of the system, in particular the impedance of the noise device 20 and the network 21 were not considered for choosing the active filter design. However, it was found out that the performance of each of those eight topologies depend not only on the bandwidth and the parameters of the filter, but also on the impedance distributions of the noise source Zs (in FIG. 1 the device 20) and of the load $Z_L$ (in FIG. 1 the network 21) in the bandwidth of the active filter 22. Consequently the choice of each filter design depends a lot on the application. It was found out that for an EMI filter, preferably with a large bandwidth of at least between 150 kHz and 10 MHz, preferably even of at least between 150 kHz and 30 MHz, for DC networks in vehicles proof to be particularly performant. However, it is also possible to use one of the other seven active filter designs described.

Figure 4:
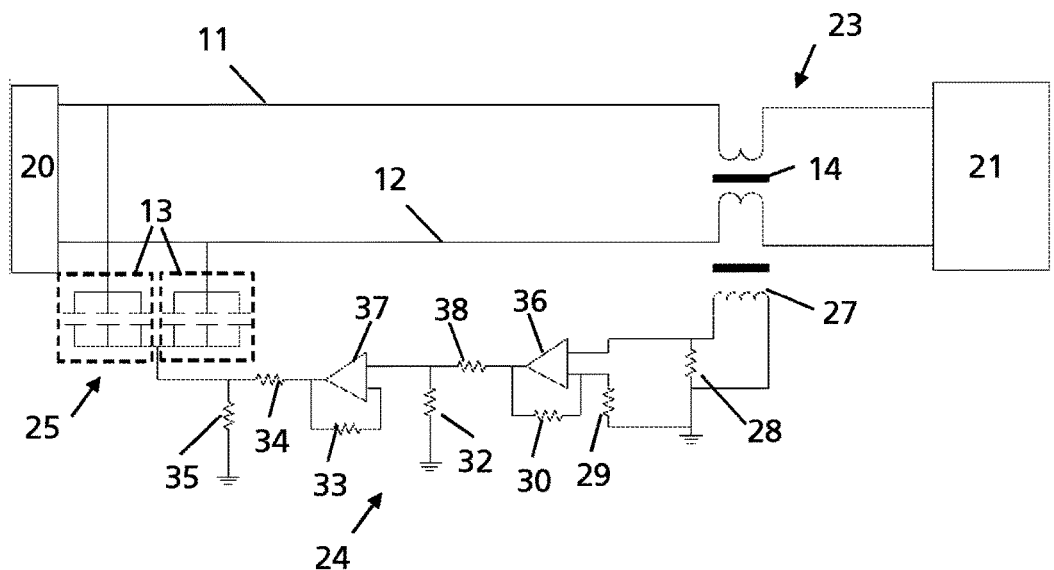
FIG. 4 shows an embodiment of a circuit diagram of an embodiment of the active filter.

FIG. 4 shows an embodiment of a circuit of the active filter 22. A preferred embodiment of the sensing section 23, the gain section 24 and the injection section 25 is described. The following disclosure of the circuit of each section 23, 24 and 25 is particularly advantageous in their combination, but the disclosure of the circuit of each section 23, 24 and 25 can also be combined with other realisations of the other sections.

In one embodiment, the sensing section 23 is configured to measure a noise current in the first power conductor 11 and in the second power conductor 12. Preferably, the sensing section 23 comprises a current transformer for measuring a noise current in the frequency bandwidth of the active filter 22 current in the first power conductor 11 and in the second power conductor 12. The current transformer comprises a core 14 for inductively coupling the first and second power conductor 11 and 12 with an auxiliary conductor to induce the noise current of the first power conductor 11 and of the second power conductor 12 in the auxiliary conductor. Preferably, the core 14 couples the first and second power conductor 11 and 12 such that the currents of the same size in opposed direction create magnetic fields in the core 14 which cancel each other out (DC current compensated). The common mode currents flowing on the first and second power conductor 11 and 12 in the same direction are induced (in the frequency bandwidth of the active filter 22) in the auxiliary winding. So, preferably the current transformer is a current compensated common mode current transformer. It was found out that one bottleneck of the bandwidth of active filters 22 was the material of the core (and the number of primary and auxiliary windings of the current transformer). Mostly used nanocrystaline core materials might have a high permeability, but its permeability varies over a large frequency bandwidth. It was shown that a core material with a substantially constant permeability in the bandwidth of the active filter 22 significantly improves the performance of the active filter 22, even if the permeability is much lower. An Example for such a core material is MgZn ferrite. Considering the high frequencies up to 30 MHz to be filtered, small delays created by sensing section 23, the gain section 24 and the injection section 25 could rather amplify the noise than cancel it by the injection of the cancelling noise. Therefore, the delay created by sensing section 23, the gain section 24 and the injection section 25 must be kept as low as possible, preferably lower than 4 nano seconds. A further measure to achieve this is to use less than 3 windings, preferably less than 2 windings, preferably 1 or less windings around the core 14 in the auxiliary conductor 27. This reduces the parasitic inductance and capacitance and thus reduces the delay caused by the current transformer. Preferably, the winding direction of the auxiliary conductor 27 around the core 14 is such that the induced or sensed current is opposed (multiplied by −1) to the noise current in the first and second power conductor 11, 12 such that the gain section 24 has only to amplify the sensed noise without any inverting (multiplication by −1) of the sensed noise. The inversion of the sensed noise can be effectively provided by the OpAmp stage as well. Preferably, the sensing section 23 comprises a burden resistor 28 or a transimpedance amplifier to transfer the sensed noise current into a sensed noise voltage such that the sensing section 23 gives out a sensed noise voltage to the gain section 24. The burden resistor 28 is connected parallel to the auxiliary winding of the current transformer. Other circuit arrangements are possible, but the arrangement of the burden resistor parallel to auxiliary winding of the current transformer proved to be particularly performant. Preferably, one side of the burden resistor 28 and/or one side of the winding of the auxiliary conductor 27 is connected to ground.

The gain section 24 is configured to create a cancelling noise on the basis of the sensed noise. Preferably, the gain section 24 is configured to amplify the noise sensed in the sensing section 23. Preferably, the gain section 24 receives from the sensing section 23 the noise voltage, e.g. the noise voltage over the burden resistor 28. The gain section 24 comprises preferably an operation amplifier 36. The two inputs of the operation amplifier are preferably connected with the noise voltage from the sensing section 24. Preferably, a first input (preferably the positive input) of the operational amplifier 36 is connected with a first terminal of the sensing section 23, of the burden resistor 28 and/or of the winding of the auxiliary conductor 27. Preferably, a second input (preferably the negative input) of the operational amplifier is connected (over a resistor 29) with the ground and/or with a second terminal of the sensing section 23, of the burden resistor 28 and/or of the winding of the auxiliary conductor 27. Preferably, the operational amplifier 36 is operated with a closed loop feedback control, i.e. the second terminal is connected over a resistor 30 with the output of the operational amplifier 36. The gain section 24 can comprise a further amplifier stage. Preferably, the output of the operational amplifier 36 is fed over a resistor 38 into a first (preferably positive) input of a second operational amplifier 37. A second (preferably negative) input of the second operational amplifier 37 is connected (over a resistor 33) with an output of the second operational amplifier 37. The first input of the second operational amplifier 37 is preferably connected (over a resistor 32) to ground. The output of the first or second operational amplifier 36 or 37 is connected (over a resistor 34) to an input of the injection section 25. The described circuit is just one example of how the gain section 24 can be realized. However, the present embodiment shows a particularly performant gain section 24 in the bandwidth of the present filter. Other suitable OpAmp configurations for the gain section 24 are the "Two OpAmp Instrumentation Amplifier" and the "Three OpAmp Instrumentation Amplifier".

Figure 5:
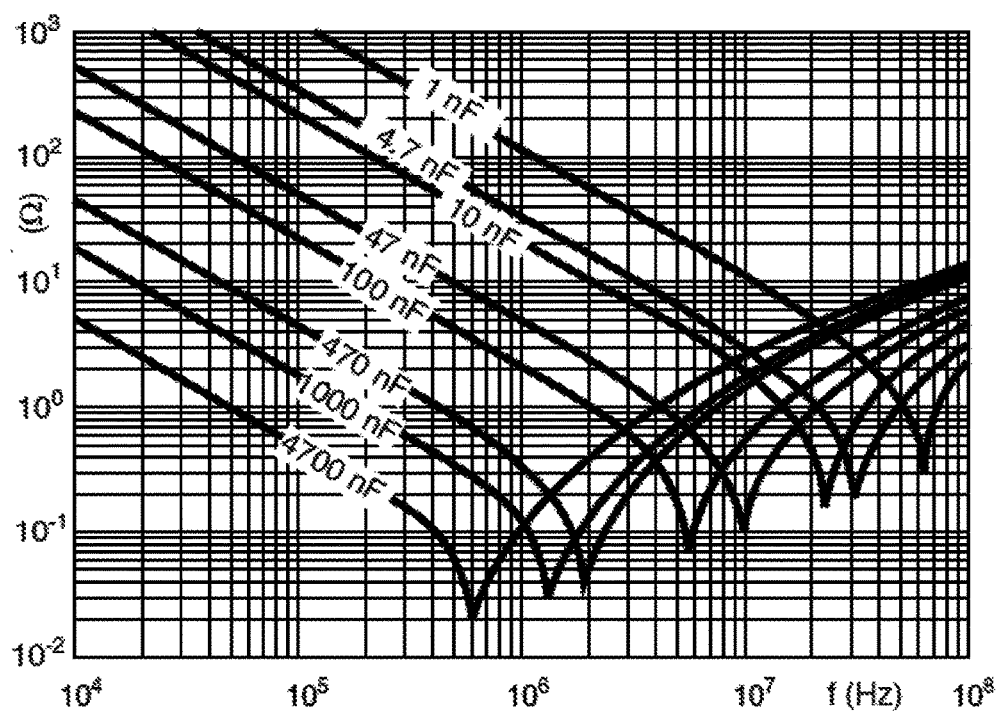
FIG. 5 shows the impedance of different capacitors over the frequency.

In one embodiment, the injection section 25 is configured to inject the cancelling noise current from the gain section 24 into the first and second power conductor 11 and 12 such that the noise current is cancelled (or at least reduced) by the cancelling noise current. Preferably, a coupling capacitance 13 is used to inject the cancelling noise into the first and second power conductor 11 and 12. Preferably, the cancelling noise is injected over a first coupling capacitance 13 in the first power conductor 1 and over a second coupling capacitance 13 in a second power conductor 12. It was discovered that the bandwidth of the coupling capacitance 13 is important for the performance of the active filter 22. The impedance of an ideal capacitor decreases for higher frequencies. However, due to a parasitic inductance in real capacitors, the impedance of a capacitor starts to increase again after the series resonant frequency of the capacitance and the parasitic inductance. FIG. 5 show the impedance characteristic of different capacitors over the frequency. In a preferred embodiment, each coupling capacitance 13 comprises a plurality of parallel capacitors with different capacitive values. Consequently, the cancelling noise for each frequency can always select the path with the capacitor which offers the lowest impedance for this frequency (the total impedance of the parallel capacitors is dominated for each frequency by the smallest impedance). Each of the parallel capacitors of the coupling capacitance 13 is connected on one side with the output of the gain section 24 and on the other side with the injection point or with the first or second power conductor 11 or 12 between the input of the active filter 22 and the sensing section 23.

With the preferred embodiment of the active filter 22 an active noise attenuation of 60 dB at 100 kHz, 40 dB at 1 MHz and 20 dB at 10 MHz was achieved. This active filter 22 is the first active filter being so performant over such a large bandwidth. It is also the first active filter 22 whose bandwidth performance was optimized for each of the sensing, gain and injection section.

Figure 11:
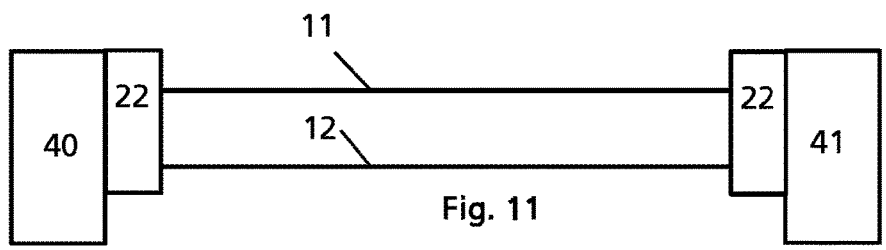
FIG. 11 shows the application of an active EMI filter in a power system of an electrically driven vehicle.

A preferred application of this active filter 22 is in electric vehicles, e.g. in electric motorbikes, cars and trucks. In particular, the DC network with the first power conductor 11 and the second power conductor 12 between a battery 40 and a charging interface 41 could comprise such an EMI active filter 22 for cancelling the EMI as shown in FIG. 11. The charging interface 41 comprises often power converter to convert the power from an external network (often AC) into DC. Such power converters are often a source of EMI. Also the battery management is another source of EMI. In particular, the input and/or output of the battery 40 and/or of the charging interface 41 and/or of potential further components like power converters could be connected each with such an EMI active filter 22.

Figure 6:
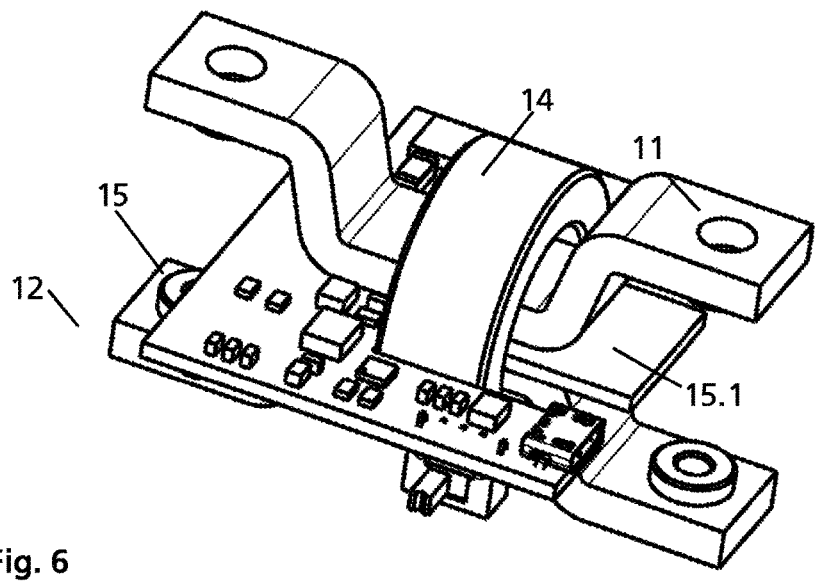
FIG. 6 shows a three-dimensional view of an embodiment of a mechanical construction of the active filter in a mounted state.
Figure 7:
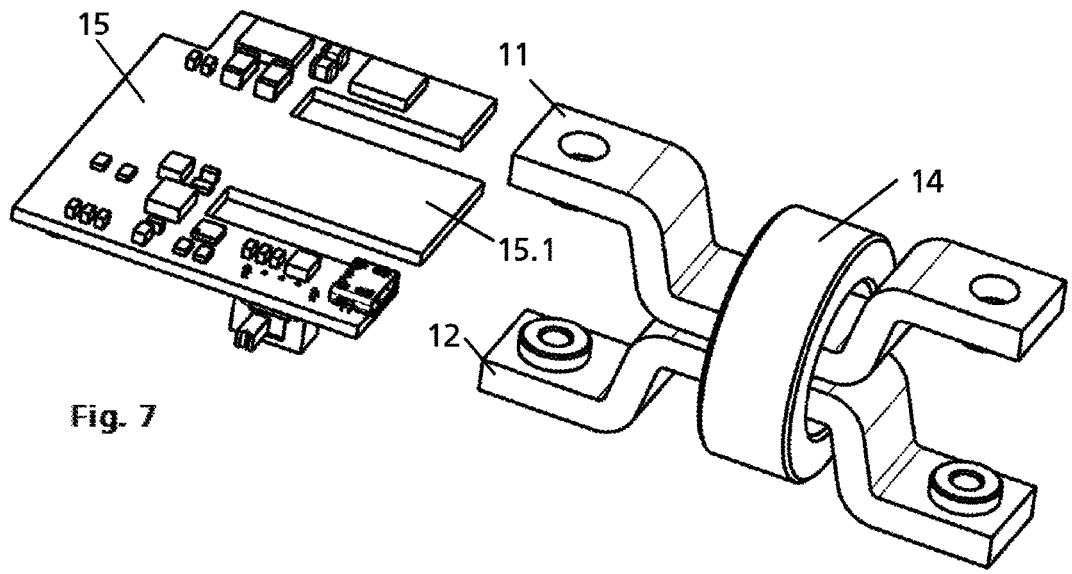
FIG. 7 shows a three-dimensional view of the embodiment of the mechanical construction of FIG. 4 in an dismounted state.
Figure 8:
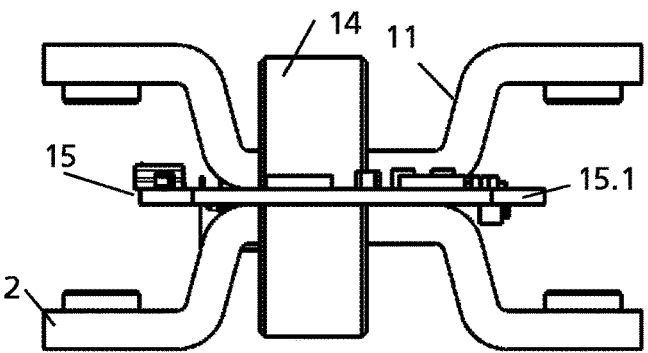
FIG. 8 shows a first side view of the embodiment of the mechanical construction of FIG. 4.
Figure 9:
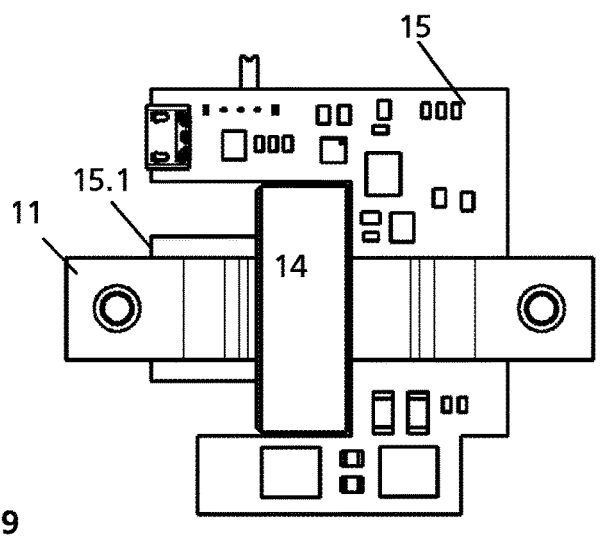
FIG. 9 shows a second side view of the embodiment of the mechanical construction of FIG. 4.
Figure 10:
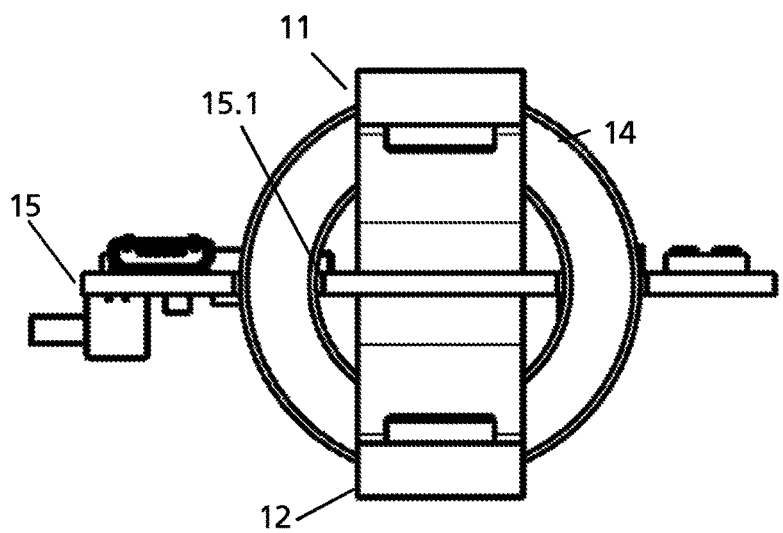
FIG. 10 shows a third side view of the embodiment of the mechanical construction of FIG. 4.

FIGS. 6, 8, 9 and 10 describe a preferred constructional design of the described active filter 2. FIG. 6 shows a three-dimensional view, while FIGS. 8, 9 and 10 show three side views of the filter 22. The cancellation section 24 and the injection section 25 are preferably realised in a PCB 15. The core 14 is arranged around the first power conductor 11 and the second power conductor 12 in a feed-through arrangement. The core 14 is preferably a ring core, preferably a closed ring core without airgap, wherein the first power conductor 11 and the second power conductor 12 are led (without windings or also called with a half winding) through an opening of the ring core 14. Ring core 14 is not limited to circular ring forms. Also other ring cross-sectional forms like ellipsoid, quadratic, rectangular are also possible. Preferably, the first power conductor 11 and the second power conductor 12 are busbars. Preferably, the busbars are directly connected with the PCB such as to conductively connect with the injection section 25 of the PCB 15. The busbars could be connected to the PCB by soldering, screwing or PCB inserts. Preferably, the PCB 15 is arranged between the two busbars 11 and 12 to isolate them from each other. Therefore, the PCB 15 does not only carry the circuit of the cancellation section 24 and the injection section 25, but has several further functions. It mechanically holds the busbars 11, 12, it creates the electrical connection between busbars 11, 12 and the injection section 25 and/or it isolates the busbars from each other. As shown in FIG. 8, the busbars 11, 12 are formed or meandered such that they have different distances in different regions. In the region of the core 14 and/or in the region of the mechanical and electrical connection between the busbars 11, 12 and the PCB 15, the busbars 11, 12 have a smaller distance than at the ends of the busbars 11, 12, where the active filter 22 provides the input and output terminals of the active filter 22. Preferably, the busbar 11, 12 has a rectangular cross-section with two flat sides and two small sides. The busbars 11, 12 are arranged with the flat sides on the PCB 15. The PCB 15 comprises further two recesses for receiving the ring core 14. FIG. 7 shows how the ring core 14 with the two busbars 11, 12 led through the opening of the core 14 can be inserted in the two recesses. The PCB 15 forms between the two recesses a protrusion 15.1 which is led through the opening of the core 14 between the two busbars 11, 12. Thus, the protrusion 15.1 of the PCB 15 isolates the two busbars 11, 12 from each other notwithstanding their close arrangement. The protrusion 15.1 allows further to realize the winding of the auxiliary conductor 27 as a conductor on the PCB 15 (not shown). In this case, the auxiliary conductor 27 is connected from the protrusion 15.1 over the recess to the rest of the PCB 15 by a bridge or a wire. It is however also possible to realize the winding of the auxiliary conductor 27 by a wire.

The active filter 22 comprises further a housing (not shown) covering the PCB 15 and the core 14 such that only the four ends of the two busbars 11, 12 protrude from the filter housing.

The invention claimed is:

1. A power system comprising:
   a DC network with a first power conductor and a second power conductor;
   an EMI filter in the DC network, wherein the EMI filter comprises an active circuit, wherein the active circuit comprises:
   a sensing section for sensing a noise in the first and second power conductor,
   a gain section for generating a cancelling noise on the basis of the noise sensed in the sensing section, and
   an injection section for injecting the cancelling noise from the gain section into the first power conductor or the second power conductor, wherein the injection section comprises a first coupling capacitance configured to inject the cancelling noise in the first power conductor, wherein the first coupling capacitance comprises a plurality of parallel capacitors with different capacitive values.

2. The power system according to claim 1, wherein the injection section comprises a second coupling capacitance configured to inject the cancelling noise in the second power conductor, wherein the second coupling capacitance comprises a plurality of parallel capacitors with different capacitive values.

3. The power system according to claim 2, wherein the gain section comprises an output point for outputting the cancelling noise, wherein the first coupling capacitance is connected with a first terminal to the first power conductor and with a second terminal to the output point of the gain section, wherein the second coupling capacitance is connected with a first terminal to the second power conductor and with a second terminal to the output point of the gain section.

4. The power system according to claim 1, wherein the sensing section comprises a current transformer with a core inductively coupling the first power conductor, the second power conductor and an auxiliary conductor of the active circuit, wherein the auxiliary conductor is connected to the gain section.

5. The power system according to claim 4, wherein a material of the core has a constant permeability between 150 kHz and 30 MHz.

6. The power system according to claim 4, wherein the material of the core comprises MgZn.

7. The power system according to claim 4, wherein the sensing section comprises a burden resistor parallel to the current transformer to transform the measured noise current into a noise voltage.

8. The power system according to claim 4, wherein the auxiliary conductor comprises less than 3 windings around the core, preferably less than 2 windings.

9. The power system according to claim 8, wherein the first power conductor is a first busbar, wherein the second power conductor is a second busbar, wherein the core is a ring core enclosing the first busbar and the second busbar.

10. The power system according to claim 4, wherein the first power conductor is a first busbar, wherein the second power conductor is a second busbar, wherein the core is a ring core enclosing the first busbar and the second busbar.

11. The power system according to claim 10, wherein a printed circuit board is arranged between the first busbar and the second busbar at least in the opening of the ring core.

12. The power system according to claim 4, wherein a printed circuit board comprises the gain section and the injection section, wherein the first power conductor is a first busbar, wherein the second power conductor is a second busbar, wherein the first busbar and/or the second busbar are directly connected on the PCB for the electrical connection with the injection section.

13. The power system according to claim 4, wherein a printed circuit board comprises the gain section and the injection section, wherein the core is a ring core, wherein the PCB comprises two recesses and a protrusion between the two recesses, wherein the ring core is received in the two recesses such that the protrusion extends through an opening formed by the ring core.

14. The power system according to claim 1, wherein the active circuit is connected to ground such that a cancelling noise current injected in the first power conductor and the second power conductor can flow back to the active circuit through said ground connection.

15. EMI filter for a DC network comprising a first power conductor, a second power conductor and an active circuit, wherein the active circuit comprises:
    a sensing section for sensing a noise in the first and second power conductor,
    a gain section for generating a cancelling noise on the basis of the noise sensed in the sensing section, and
    an injection section for injecting the cancelling noise from the gain section into the first power conductor or the second power conductor, wherein the injection section comprises a first coupling capacitance configured to inject the cancelling noise in the first power conductor, wherein the first coupling capacitance comprises a plurality of parallel capacitors with different capacitive values, wherein the active circuit is configured to reduce the noise in at least the complete bandwidth between 150 kHz and 30 MHz.

16. The power system according to claim 2, wherein the sensing section comprises a current transformer to sense a noise current in the first power conductor and the second power conductor, wherein the gain section is configured for generating a cancelling noise on the basis of the noise current sensed in the sensing section, and the injection section is configured for injecting with a coupling capacitance the cancelling noise from the gain section into the first power conductor and the second power conductor, wherein the sensing section and the injection section are arranged in a feedback orientation meaning that the injection point of an injection section is arranged upstream of a sensing point of the sensing section in the direction of the noise current.

17. A power system for an electrically driven vehicle comprising:
    a battery;
    a charging interface for receiving external power to charge the battery;
    a network connecting the battery and the charging interface, wherein at least a part of the network is a DC network;
    an EMI filter between the battery and the charging interface in the DC network, wherein the EMI filter comprises an active circuit, wherein the active circuit comprises:
    a sensing section comprising a current transformer to sense a noise current in the first power conductor and the second power conductor, wherein the sensing section comprises a current transformer with a core inductively coupling the first power conductor, the second power conductor and an auxiliary conductor of the active circuit, wherein the auxiliary conductor is connected to a gain section, wherein a material of the core has a constant permeability between 150 kHz and 30 MHz, the gain section for generating a cancelling noise on the basis of the noise current sensed in the sensing section, and an injection section for injecting with a coupling capacitance the cancelling noise from the gain section into the first power conductor and the second power conductor, wherein the sensing section and the injection section are arranged in a feedback orientation meaning that an injection point of the injection section is arranged upstream of a sensing point of the sensing section in the direction of the noise current.

18. A power system for an electrically driven vehicle comprising:

a battery;

a charging interface for receiving external power to charge the battery;

a DC network connecting the battery and the charging interface;

an EMI filter between the battery and the charging interface in the DC network, wherein the EMI filter comprises an active circuit, wherein the active circuit comprises:

a sensing section comprising a current transformer to sense a noise current in the first power conductor and the second power conductor, a gain section for generating a cancelling noise on the basis of the noise current sensed in the sensing section, and an injection section for injecting with a coupling capacitance the cancelling noise from the gain section into the first power conductor and the second power conductor, wherein the sensing section and the injection section are arranged in a feedback orientation meaning that an injection point of the injection section is arranged upstream of a sensing point of the sensing section in the direction of the noise current.

19. The power system according to claim 18, wherein the sensing section comprises a current transformer with a core inductively coupling the first power conductor, the second power conductor and an auxiliary conductor of the active circuit, wherein the auxiliary conductor is connected to the gain section, wherein the auxiliary conductor comprises less than less than 3 windings.

20. The power system according to claim 18, wherein the active circuit is configured to reduce the noise in at least the complete bandwidth between 150 kHz and 30 MHz.

21. The power system according to claim 18, wherein the injection point of the injection section is arranged upstream of the sensing point of the sensing section in the direction of the noise current so that the sensing section senses the difference between the noise current and the injected cancelling noise.

22. The power system according to claim 18, wherein the EMI filter is arranged in a feedback orientation with respect to the noise current from the charging interface as a noise source, wherein the power system comprises a second EMI filter between the battery and the EMI filter in the DC network, wherein the second EMI filter comprises a second active circuit, wherein the second active circuit comprises:

a second sensing section comprising a current transformer to sense a second noise current in the first power conductor and the second power conductor, a second gain section for generating a second cancelling noise on the basis of the second noise current sensed in the second sensing section, and a second injection section for injecting with a coupling capacitance the second cancelling noise from the second gain section into the first power conductor and the second power conductor, wherein the second sensing section and the second injection section are arranged in a feedback orientation meaning that an injection point of the second injection section is arranged upstream of a sensing point of the second sensing section in the direction of the noise current from the battery as a noise source.

23. The power system according to claim 22, wherein the charging interface comprises a power converter.

24. The power system according to claim 17, wherein the active circuit is configured to reduce the noise in at least the complete bandwidth between 150 kHz and 30 MHz.

25. The power system according to claim 17, wherein the auxiliary conductor comprises less than less than 3 windings.

* * * * *